(12) United States Patent
Qi et al.

(10) Patent No.: US 11,942,485 B2
(45) Date of Patent: Mar. 26, 2024

(54) SUBSTRATE HAVING DUAL EDGE CONNECTION LINE AND METHOD FOR MANUFACTURING THE SAME, DISPLAY PANEL, AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Yonglian Qi, Beijing (CN); Hong Yang, Beijing (CN); Lianjie Qu, Beijing (CN); Shan Zhang, Beijing (CN); Hebin Zhao, Beijing (CN); Yun Qiu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 624 days.

(21) Appl. No.: 17/020,133

(22) Filed: Sep. 14, 2020

(65) Prior Publication Data

US 2021/0183897 A1 Jun. 17, 2021

(30) Foreign Application Priority Data

Dec. 11, 2019 (CN) .......................... 201911269401.6

(51) Int. Cl.
*H01L 27/14* (2006.01)
*H01L 25/075* (2006.01)
(Continued)

(52) U.S. Cl.
CPC ........ *H01L 27/124* (2013.01); *H01L 25/0753* (2013.01); *H01L 27/1266* (2013.01); *H01L 27/1288* (2013.01)

(58) Field of Classification Search
CPC .............. H01L 27/124; H01L 25/0753; H01L 27/1266; H01L 27/1288; H01L 33/62; H01L 25/167; G09F 9/33
See application file for complete search history.

(56) References Cited

U.S. PATENT DOCUMENTS 5,454,927 A * 10/1995 Credle .................. H05K 3/426
205/224
5,869,392 A 2/1999 Kimura
(Continued)

FOREIGN PATENT DOCUMENTS

CN 101584040 A 11/2009
CN 105870076 A 8/2016
(Continued)

OTHER PUBLICATIONS

Office Action dated May 21, 2021 from corresponding CN Patent Application No. 201911269401.6, 17 pages.

*Primary Examiner* — Ismail A Muse
(74) *Attorney, Agent, or Firm* — Procopio, Cory, Hargreaves & Savitch LLP

(57) ABSTRACT

A substrate includes a driving backplane, a plurality of first connecting lines and a plurality of second connecting lines. The driving backplane includes a base substrate, at least one first lead group and at least one second lead group. Each first lead group includes a plurality of first leads, and each second lead group includes a plurality of second leads. A first lead group and a corresponding second lead group is disposed in a peripheral region. The plurality of first connecting lines are disposed on at least one side face of the driving backplane, each first connecting line is electrically connected to at least one first lead. The plurality of second connecting lines are disposed on the at least one side face of the driving backplane, each second connecting line is electrically connected (Continued)

to at least one second lead, and is in contact with a corresponding first connecting line.

18 Claims, 10 Drawing Sheets

(51) Int. Cl.
*H01L 27/12* (2006.01)
*H01L 29/04* (2006.01)
*H01L 29/15* (2006.01)
*H01L 31/036* (2006.01)

(56) References Cited

U.S. PATENT DOCUMENTS

| | | | |
|---|---|---|---|
| 8,541,884 B2 | 9/2013 | Conn et al. | |
| 2004/0183192 A1* | 9/2004 | Otsuka | H01L 24/82 257/734 |
| 2004/0187917 A1* | 9/2004 | Pichler | G02F 1/155 136/263 |
| 2007/0080360 A1 | 4/2007 | Mirsky et al. | |
| 2008/0315459 A1 | 12/2008 | Zhang et al. | |
| 2016/0233292 A1 | 8/2016 | Chen | |
| 2017/0092562 A1 | 3/2017 | Kato | |
| 2018/0301500 A1* | 10/2018 | You | G06V 10/147 |
| 2018/0358291 A1 | 12/2018 | Chen et al. | |
| 2019/0289717 A1 | 9/2019 | Yueh et al. | |
| 2020/0013803 A1* | 1/2020 | Jang | H01L 25/167 |
| 2020/0259056 A1* | 8/2020 | Hong | H01L 27/1262 |
| 2020/0312883 A1 | 10/2020 | Qu et al. | |

FOREIGN PATENT DOCUMENTS

| | | |
|---|---|---|
| CN | 106057829 A | 10/2016 |
| CN | 106684097 A | 5/2017 |
| CN | 108663855 A | 10/2018 |
| CN | 109037188 A | 12/2018 |
| CN | 109950226 A | 6/2019 |
| CN | 110277365 A | 9/2019 |
| IN | 101678578 A | 3/2010 |
| IN | 110112171 A | 8/2019 |
| JP | 3344615 B2 | 8/2020 |
| WO | 2016006317 A1 | 1/2016 |

* cited by examiner

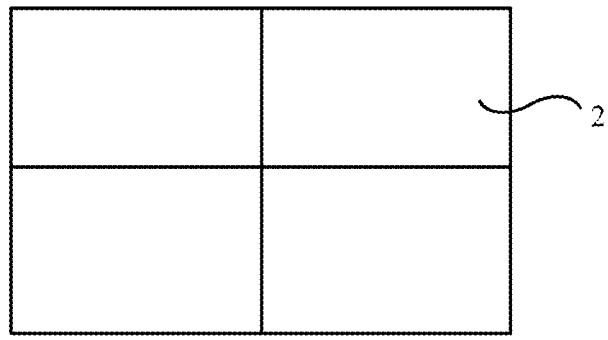

FIG. 6

At least one strip-shaped groove corresponding to each driving backplane to be cut is formed in a third surface of a driving backplane motherboard which includes at least one driving backplane to be cut — S101

A plurality of first connecting lines insulated from each other are formed in a region in which the first strip-shaped groove is located. Each first connecting line extends to a surface of at least one first lead and is in contact with the at least one first lead — S102

At least one second strip-shaped hole is formed in a fourth surface of the driving backplane motherboard that is opposite to the third surface, and each second strip-shaped hole is connected to a corresponding first strip-shaped groove — S103

A plurality of second connecting lines insulated from each other are formed in a region in which the second strip-shaped hole is located, and each second connecting line is in contact with a corresponding first connecting line. The second connecting line extends to a surface of at least one second lead and is in contact with the at least one second lead in the second lead group — S104

The driving backplane motherboard is cut into at least one driving backplane. The plurality of first connecting lines insulated from each other and the plurality of second connecting lines insulated from each other are formed on at least one side face of each driving backplane — S105

FIG. 7

SUBSTRATE HAVING DUAL EDGE CONNECTION LINE AND METHOD FOR MANUFACTURING THE SAME, DISPLAY PANEL, AND DISPLAY APPARATUS

CROSS-REFERENCE TO RELATED APPLICATION

This application claims priority to and the benefit of Chinese Patent Application No. 201911269401.6, filed on Dec. 11, 2019, which is incorporated herein by reference in its entirety.

TECHNICAL FIELD

The present disclosure relates to the field of display technologies, and in particular, to a substrate and a method for manufacturing the same, a display panel and a display apparatus.

BACKGROUND

Micro light-emitting diode (Micro-LED) display panels have characteristics of ultra-high pixel count, ultra-high resolution, low energy consumption and long service life. A Micro-LED display panel includes a miniaturized LED matrix array in which each LED has a tiny size. The Micro-LED display panel consumes less power, and may have a high color gamut.

SUMMARY

In an aspect, embodiments of the present disclosure provide a substrate including a driving backplane, a plurality of first connecting lines insulated from each other and a plurality of second connecting lines insulated from each other. The driving backplane has a display area and at least one peripheral region located on a periphery of the display area. The driving backplane includes a base substrate, at least one first lead group and at least one second lead group. The base substrate includes a first surface and a second surface opposite to the first surface. The at least one first lead group is disposed on the first surface of the base substrate, each first lead group includes a plurality of first leads. The at least one second lead group is disposed on the second surface of the base substrate, a first lead group and a corresponding second lead group are disposed in a peripheral region; and each second lead group includes a plurality of second leads.

In some embodiments, orthographic projections of the first connecting line and the corresponding second connecting line on a side face of the driving backplane where the first connecting line and the corresponding second connecting line are located do not overlap.

In some embodiments, an interface between the first connecting line and the corresponding second connecting line is substantially located at a position at half a thickness of the base substrate.

In some embodiments, the first connecting line extends to the first surface of the base substrate and is in lap joint with the at least one first lead; and the second connecting line extends to the second surface of the base substrate and is in lap joint with the at least one second lead.

In some embodiments, the substrate further includes a protective layer disposed on the at least one side face, and the protective layer covers the plurality of first connecting lines and the plurality of second connecting lines.

In some embodiments, the protective layer includes a resin material.

In some embodiments, the plurality of first connecting lines and the plurality of second connecting lines are made of a same metal material or different metal materials.

In some embodiments, the substrate further includes a plurality of micro light-emitting diodes (Micro-LEDs) disposed on the first surface of the base substrate.

In another aspect, embodiments of the present disclosure provide a display panel including the substrate described above.

In yet another aspect, embodiments of the present disclosure provide a display apparatus including at least one display panel described above.

In some embodiments, the at least one display panel includes a plurality of display panels that are spliced together.

In yet another aspect, embodiments of the present disclosure provide a method for manufacturing a substrate. The method includes: forming at least one first strip-shaped groove corresponding to each driving backplane to be cut in a third surface of a driving backplane motherboard which includes at least one driving backplane to be cut, wherein the driving backplane to be cut has a display area and at least one peripheral region located on a periphery of the display area; and each first lead group and a corresponding second lead group of the driving backplane to be cut are disposed in one peripheral region; and each first strip-shaped groove is in contact with a corresponding peripheral region where a first lead group and a second lead group are disposed; forming a plurality of first connecting lines insulated from each other in a region in which the first strip-shaped groove is located, wherein each first connecting line extends to a surface of at least one first lead and is in contact with the at least one first lead; forming at least one second strip-shaped hole in a fourth surface of the driving backplane motherboard that is opposite to the third surface, each second strip-shaped hole being connected to a corresponding first strip-shaped groove; forming a plurality of second connecting lines insulated from each other in a region in which the second strip-shaped hole is located, wherein each second connecting line is in contact with a corresponding first connecting line, and the second connecting line extends to a surface of at least one second lead and is in contact with the at least one second lead; and cutting the driving backplane motherboard to obtain at least one driving backplane, and the plurality of first connecting lines and the plurality of second connecting lines being formed on at least one side face of each driving backplane.

In some embodiments, each second strip-shaped hole and a corresponding first strip-shaped groove are both in contact with an edge of a corresponding peripheral region away from the display area and extend along the edge of the corresponding peripheral region.

In some embodiments, a base motherboard of the driving backplane motherboard is a glass motherboard. Forming the at least one first strip-shaped groove corresponding to each driving backplane to be cut in the third surface of the driving backplane motherboard includes: forming the at least one first strip-shaped groove corresponding to each driving backplane to be cut in the third surface of the driving backplane motherboard by using a laser cutting method. And forming the at least one second strip-shaped hole in the fourth surface of the driving backplane motherboard includes: forming the at least one second strip-shaped hole in the fourth surface of the driving backplane motherboard by using the laser cutting method.

In some embodiments, a base motherboard of the driving backplane motherboard is a flexible resin motherboard. Forming the at least one first strip-shaped groove corresponding to each driving backplane to be cut in the third surface of the driving backplane motherboard includes: forming the at least one first strip-shaped groove corresponding to each driving backplane to be cut in the third surface of the driving backplane motherboard by using an etching process. And forming the at least one second strip-shaped hole in the fourth surface of the driving backplane motherboard includes: forming the at least one second strip-shaped hole in the fourth surface of the driving backplane motherboard by using the etching process.

In some embodiments, forming the at least one first strip-shaped groove corresponding to each driving backplane to be cut includes: forming a single first strip-shaped groove corresponding to the driving backplane to be cut, or, forming two first strip-shaped grooves parallel to each other and located at two opposite edges of the driving backplane to be cut, respectively.

In some embodiments, forming the plurality of first connecting lines insulated from each other includes: forming a first metal layer on the third surface of the driving backplane motherboard by using a sputtering process, the first metal layer including a portion filling the first strip-shaped groove; forming a first photoresist layer on the first metal layer; exposing and developing the first photoresist layer; and etching the first metal layer to form the plurality of first connecting lines insulated from each other in the region in which the first strip-shaped groove is located. And/or, forming the plurality of second connecting lines insulated from each other includes: forming a second metal layer on the fourth surface of the driving backplane motherboard by using the sputtering process, the second metal layer including a portion filling the second strip-shaped hole; forming a second photoresist layer on the second metal layer; exposing and developing the second photoresist layer; and etching the second metal layer to form the plurality of second connecting lines insulated from each other in the region in which the second strip-shaped hole is located.

In some embodiments, forming the plurality of first connecting lines insulated from each other includes: forming the plurality of first connecting lines insulated from each other through an evaporation process by using a first mask. And/or, forming the plurality of second connecting lines insulated from each other includes: forming the plurality of second connecting lines insulated from each other through the evaporation process by using a second mask.

In some embodiments, after the plurality of first connecting lines are formed, the method further includes: turning the driving backplane motherboard 180 degrees; placing the turned driving backplane motherboard on a temporary substrate; and bonding the third surface of the driving backplane motherboard to the temporary substrate by a temporary bonding adhesive. And after the plurality of second connecting lines are formed, the method further includes: separating the temporary substrate from the driving backplane motherboard.

In some embodiments, cutting the driving backplane motherboard includes: cutting the driving backplane motherboard by using a laser cutting method.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, an actual process of a method and actual timings of signals that the embodiments of the present disclosure relate to.

FIG. 6 is a schematic diagram showing a structure of a display apparatus, in accordance with some embodiments of the present disclosure;

FIG. 7 is a flow diagram of a method for manufacturing a substrate, in accordance with some embodiments of the present disclosure;

DETAILED DESCRIPTION

Figure 1A:
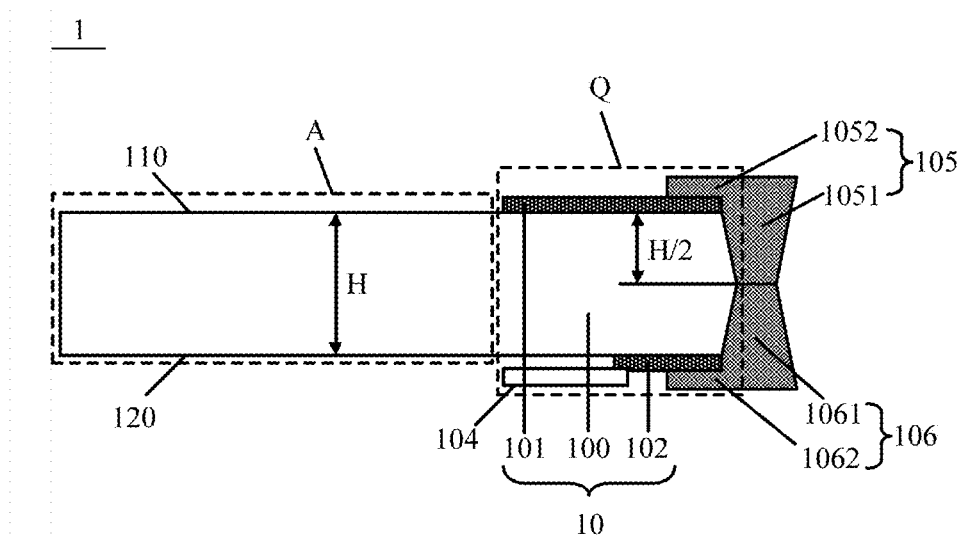
FIG. 1A is a schematic diagram showing a structure of a substrate, in accordance with some embodiments of the present disclosure.

The technical solutions in some embodiments of the present disclosure will be described clearly and completely with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" in the description and the claims are construed as open and inclusive, i.e., "inclusive, but not limited to". In the description, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

The terms such as "first" and "second" are used for descriptive purposes only and are not to be construed as indicating or implying the relative importance or implicitly indicating the number of indicated technical features below. Thus, features defined as "first" and "second" may explicitly or implicitly include one or more of the features. In the description of the embodiments of the present disclosure, term "a plurality of/the plurality of" means two or more unless otherwise specified.

In the description of some embodiments, the term such as "connected" and its extensions may be used. For example, the term "connected" may be used in the description of some embodiments to indicate that two or more components are in direct physical or electrical contact with each other. The embodiments disclosed herein are not necessarily limited to the contents herein.

It will be understood that when a layer or element is referred to as being "on" another layer or substrate, it can be directly on the other layer or substrate, or intervening layers may also be present.

In addition, the term such as "substantially" may mean that a technical feature is produced within the technical tolerance of the method used to manufacture it. For example, "substantially" can mean within one or more standard deviations, or within ±30%, 20%, 10% or 5% of the stated value.

In the related art, a micro light-emitting diode (Micro-LED) display panel includes a glass substrate and a Micro-LED array disposed on a surface of the glass substrate. At least one through hole is provided in the glass substrate, and metal is deposited in the at least one through hole to form at least one wire. The at least one wire may connect leads on the surface of the glass substrate to leads on an opposite surface of the glass substrate, so that a controller connected to the leads on the opposite surface may control the Micro-LED array to emit light. However, in a subsequent high-temperature process, it may be easy for the metal to expand and fall off from a through hole due to a difference in thermal expansion coefficient between the metal and the glass.

In the related art, a flexible printed circuit (FPC) may also be provided to electrically connect leads on two opposite surfaces of the glass substrate. However, in a case where a plurality of Micro-LED display panels are spliced to form a spliced screen, a seam of the splicing screen may be large due to a large thickness of the FPC, thereby affecting a display effect and an overall appearance.

Figure 2A:
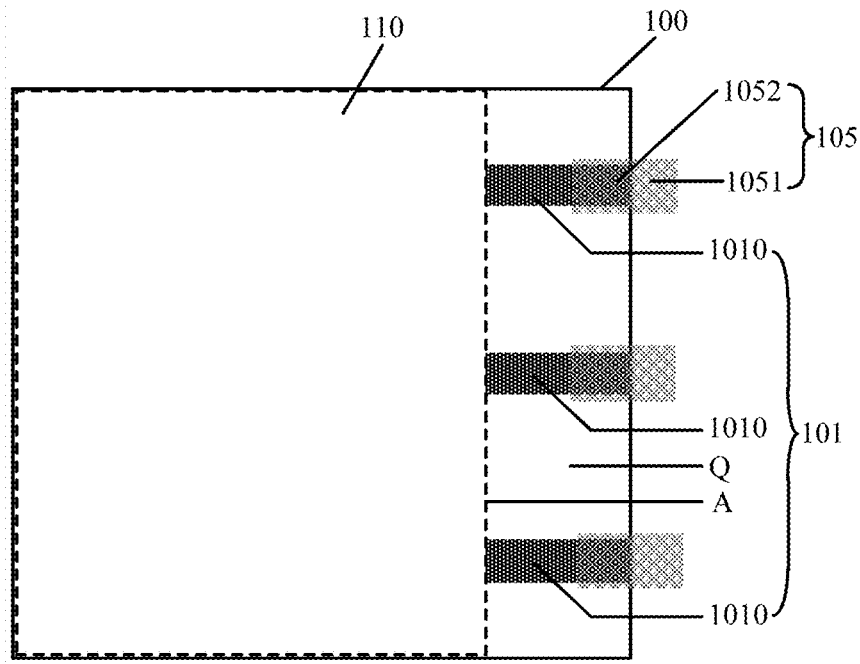
FIG. 2A is a top view of first leads and first connecting lines in a substrate, in accordance with some embodiments of the present disclosure.
Figure 2B:
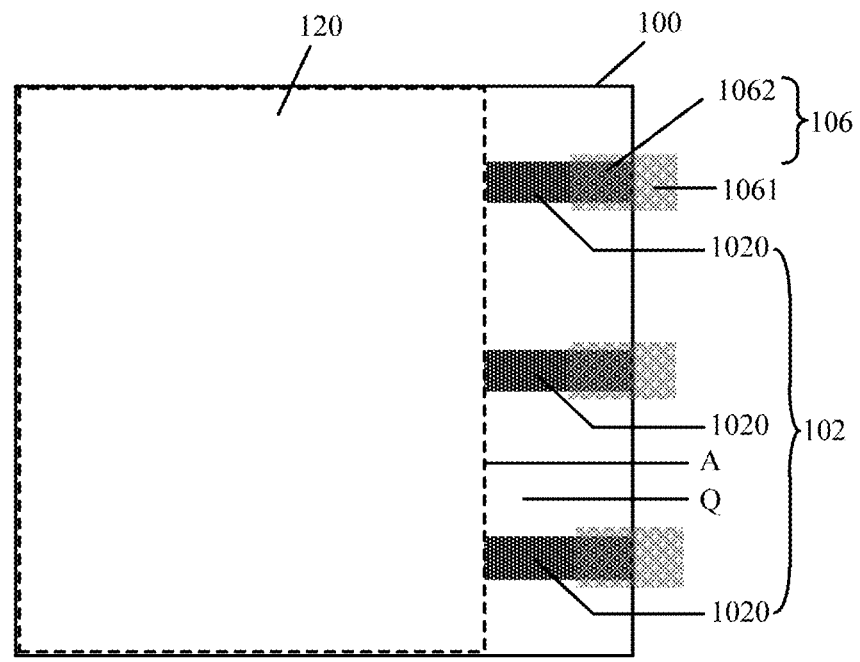
FIG. 2B is a top view of second leads and second connecting lines in a substrate, in accordance with some embodiments of the present disclosure.

As shown in FIGS. 1A, 2A and 2B, some embodiments of the present disclosure provide a substrate 1. The substrate 1 includes a driving backplane 10, a plurality of first connecting lines 105 insulated from each other, and a plurality of second connecting lines 106 insulated from each other.

As shown in FIG. 1A, the driving backplane 10 has a display area A and at least one peripheral region Q located on a periphery of the display area A. For example, the display area A is in a shape of a rectangle, and the at least one peripheral region Q includes one peripheral region Q disposed on a side of the display area A. For another example, the display area A is in a shape of a rectangle, and the at least one peripheral region Q includes two peripheral regions Q disposed on two sides of the display area A, respectively. Of course, the display area A may have other shapes, such as a circular shape.

The driving backplane 10 includes a base substrate 100, at least one first lead group 101 and at least one second lead group 102. A first lead group 101 and a corresponding second lead group 102 are disposed in a peripheral region Q. For example, each first lead group 101 and a corresponding second lead group 102 are disposed in a corresponding peripheral region Q. For example, two peripheral regions Q, two first lead groups 101 and two second lead groups 102 are provided, in which one first lead group 101 and one second lead group 102 are disposed in one peripheral region Q, and another first lead group 101 and another second lead group 102 are disposed in another peripheral region Q. Of course, the relationship between the peripheral region Q and both the first lead group 101 and the second lead group 102 may be set according to actual needs.

It will be understood that the at least one first lead group 101 and the at least one second lead group 102 are defined according to their positions. That is, a first lead group 101 or a second lead group 102 is disposed in a peripheral region Q, and another first lead group 101 or another second lead group 102 is disposed in another peripheral region Q. Of course, the embodiments of the disclosure do not limit the definition mode of the at least one first lead group 101 and the at least one second lead group 102, which may be defined according to other features.

The base substrate 100 includes a first surface 110 and a second surface 120 that are disposed opposite to each other in a thickness direction of the base substrate 100. The base substrate 100 may be a glass substrate or a flexible substrate.

The flexible substrate may be made of, for example, polyimide or polyethylene glycol terephthalate.

The at least one first lead group 101 is disposed on the first surface 110 of the base substrate 100. For example, the at least one first lead group 101 may be directly disposed on the first surface 110 of the base substrate 100, or may be disposed on other layer on the first surface 110. A first lead group 101 includes a plurality of first leads 1010. For example, each first lead group 101 includes a plurality of first leads 1010.

The at least one second lead group 102 is disposed on the second surface 120 of the base substrate 100. For example, the at least one second lead group 102 may be directly disposed on the second surface 120 of the base substrate 100, or may be disposed on other layer on the second surface 120. A second lead group 102 includes a plurality of second leads 1020. For example, each second lead group 102 includes a plurality of second leads 1020.

Figure 1B:
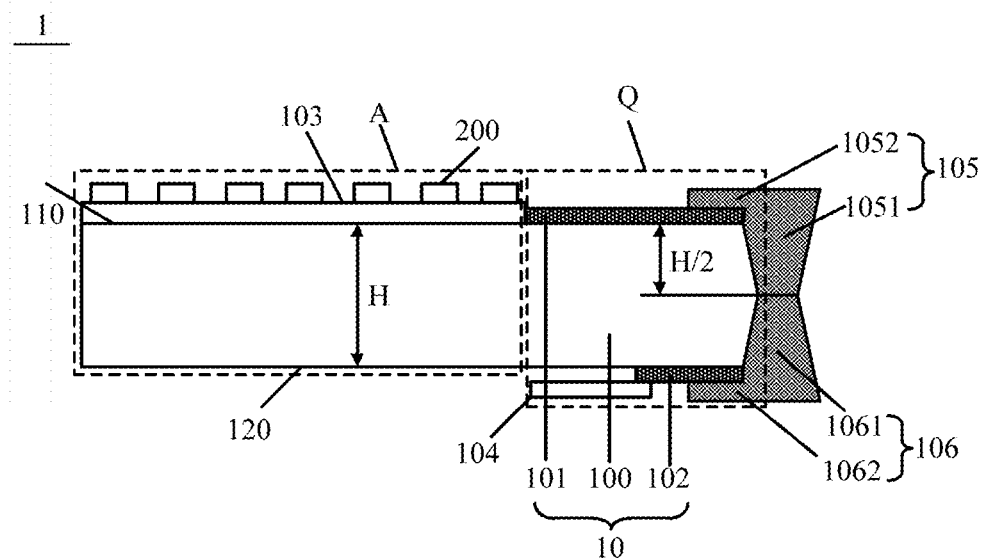
FIG. 1B is a schematic diagram showing a structure of another substrate, in accordance with some embodiments of the present disclosure.

In some embodiments, as shown in FIG. 1B, the driving backplane 10 further includes a driving circuit 103 disposed on the first surface 110 of the base substrate 100, and the plurality of first leads 1010 in the first lead group 101 are electrically connected to the driving circuit 103. The driving circuit 103 may include a plurality of sub-circuits, a plurality of gate lines and a plurality of data lines. The plurality of sub-circuits are in one-to-one correspondence with a plurality of Micro-LEDs in the Micro-LED array, and a sub-circuit is configured to drive a corresponding Micro-LED to emit light. It will be noted that, the driving circuit 103 in FIG. 1B is schematically shown, and a circuit structure of the driving circuit 103 is not shown.

The display area A includes a plurality of sub-pixel regions, and the plurality of sub-circuits are disposed in the plurality of sub-pixel regions in one-to-one correspondence. A sub-circuit includes at least one thin film transistor. Each thin film transistor includes a gate, a portion of a gate insulating layer between the gate and an active pattern, the active pattern, a source, and a drain.

In some examples, first leads 1010 of the at least one first lead group 101 may be a plurality of gate line leads. The plurality of gate line leads are in one-to-one correspondence with and electrically connected to the plurality of gate lines, and each gate line is electrically connected to gates of thin film transistors in a corresponding row of sub-pixel regions.

In some other examples, the first leads 1010 of the at least one first lead group 101 may be a plurality of data line leads. The plurality of data line leads are in one-to-one correspondence with and electrically connected to the plurality of data lines, and each data line is electrically connected to sources of thin film transistors in a corresponding column of sub-pixel regions.

In yet other examples, first leads 1010 of the at least one first lead group 101 may include a plurality of gate line leads and a plurality of data line leads. The plurality of gate line leads are in one-to-one correspondence with and electrically connected to the plurality of gate lines, and each gate line is electrically connected to gates of thin film transistors in a corresponding row of sub-pixel regions. The plurality of data line leads are in one-to-one correspondence with and electrically connected to the plurality of data lines, and each data line is electrically connected to sources of thin film transistors in a corresponding column of sub-pixel regions.

Of course, first leads 1010 of the at least one first lead group 101 may further include signal line leads electrically connected to other signal lines, as long as the driving backplane 10 may drive the plurality of Micro-LEDs in the Micro-LED array to emit light.

As shown in FIGS. 1A, 1B and 2A, the plurality of first connecting lines 105 are disposed on at least one side face of the driving backplane 10 adjacent to at least one peripheral region Q where the at least one first lead group 101 and the at least one second lead group 102 are disposed. Each first connecting line 105 is electrically connected to at least one first lead 1010. For example, each first connecting line 105 may be electrically connected to one first lead 1010, or several first leads 1010.

In some examples, as shown in FIGS. 1A, 1B and 2A, the plurality of first connecting lines 105 are disposed on a single side face of the driving backplane 10 adjacent to a peripheral region Q. FIG. 2A only shows an example in which there are three first connecting lines 105, but the embodiments of the present disclosure are not limited thereto. The number of the first connecting lines 105 may be set according to actual conditions.

Figure 3A:
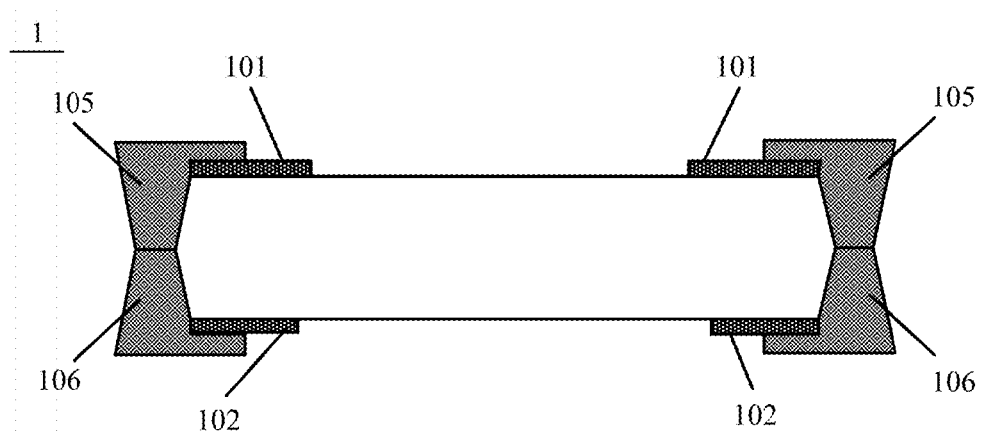
FIG. 3A is a schematic diagram showing a structure of yet another substrate, in accordance with some embodiments of the present disclosure.
Figure 3B:
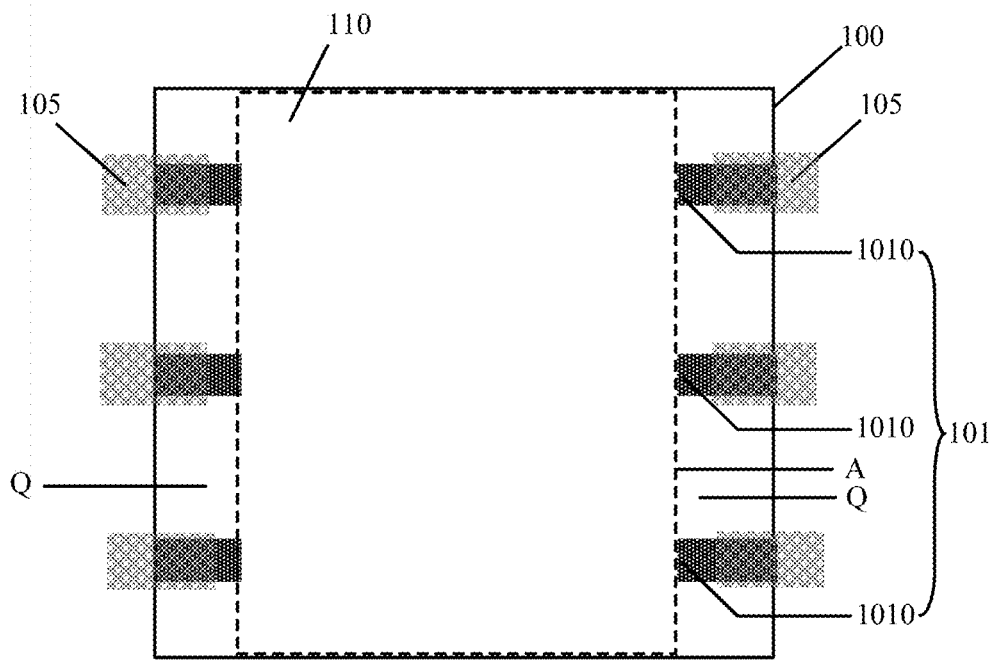
FIG. 3B is a top view of first leads and first connecting lines in another substrate, in accordance with some embodiments of the present disclosure.

In some other examples, as shown in FIGS. 3A and 3B, the plurality of first connecting lines 105 are disposed on two opposite side faces of the driving backplane 10 adjacent to two opposite peripheral regions Q, respectively. That is, some first connecting lines 105 are disposed on one side face of the driving backplane 10, and other first connecting lines 105 are disposed on the opposite side face of the driving backplane 10.

In yet other examples, the plurality of first connecting lines 105 may also be disposed on at least three side faces of the driving backplane 10, for example, three side faces or four side faces.

As shown in FIGS. 1A, 1B and 2B, the plurality of second connecting lines 106 are disposed on the at least one side face of the driving backplane 10 adjacent to the at least one peripheral region Q where the at least one first lead group 101 and the at least one second lead group 102 are disposed. Each second connecting line 106 is electrically connected to at least one second lead 1020. For example, each second connecting line 106 may be electrically connected to one second lead 1020, or several second lead 1020. FIG. 2B only shows an example in which each second connecting line 106 is electrically connected to one second lead 1020.

As shown in FIGS. 1A and 1B, each first connecting line 105 is in contact with a corresponding second connecting line 106. That is, the plurality of first connecting lines 105 are in one-to-one correspondence with the plurality of second connecting lines 106, and each first connecting line 105 and a corresponding second connecting line 106 are in contact at a corresponding side face of the driving backplane 10. In this way, the second leads 1020 and the first leads 1010 may be electrically connected through the first connecting lines 105 and the second connecting lines 106, so that the signals on the second leads 1020 may be transmitted to the driving circuit 103 of the driving backplane 10 through the second connecting lines 106, the first connecting lines 105 and the first leads 1010.

Figure 3C:
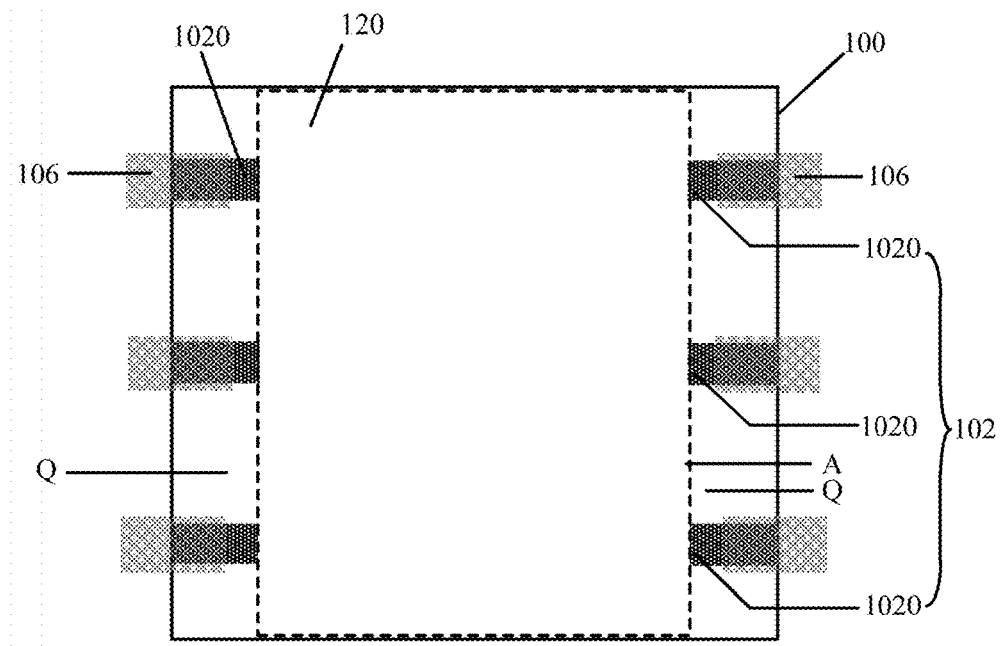
FIG. 3C is a top view of second leads and second connecting lines in another substrate, in accordance with some embodiments of the present disclosure.

In a case where the plurality of first connecting lines 105 are disposed on the single side face of the driving backplane 10, as shown in FIGS. 1A, 1B and 2B, the plurality of second connecting lines 106 are also disposed on the single side face of the driving backplane 10. In a case where the plurality of first connecting lines 105 are disposed on two side faces of the driving backplane 10, as shown in FIGS. 3A and 3C, the plurality of second connecting lines 106 are also disposed on the two side faces of the driving backplane 10. In a case where the plurality of first connecting lines 105 are disposed on at least three side faces of the driving backplane 10, the plurality of second connecting lines 106 are also disposed on the at least three side faces of the driving backplane 10. FIG.

3C only shows an example in which there are three second connecting lines 106, but the embodiments of the present disclosure are not limited thereto, and the number of the second connecting lines 106 may be set according to actual conditions.

In a case where the substrate 1 is applied to a display apparatus, as shown in FIGS. 1A and 1B, a controller 104 may also be provided on the second surface 120 of the base substrate 100, and is connected to second leads 1020 in the at least one second lead group 102 to output signals to the second leads 1020.

In some examples, in a case where the first leads 1010 in the at least one first lead group 101 are the gate line leads, the controller 104 may include at least one gate driver chip, and the second leads 1020 may be electrically connected to the at least one gate driver chip.

In some other examples, in a case where the first leads 1010 in the at least one first lead group 101 are the data line leads, the controller 104 may include at least one source driver chip, and the second leads 1020 may be electrically connected to the at least one source driver chip.

In yet other examples, in a case where the first leads 1010 in the at least one first lead group 101 include gate line leads and data line leads, the controller 104 may include at least one gate driver chip and at least one source driver chip. A part of the second leads 1020 may be electrically connected to the at least one gate driver chip, and the remaining part of the second leads 1020 may be electrically connected to the at least one source driver chip.

Of course, in a case where the first leads 1010 further include signal line leads electrically connected to other signal lines, the controller 104 may further include other chips or circuits.

It will be noted that, the above chips or circuits may be separately arranged, or may be disposed on a single circuit board.

In the substrate 1 provided by some embodiments of the present disclosure, the second leads 1020 and the first leads 1010 are electrically connected through the first connecting lines 105 and the corresponding second connecting lines 106 that are disposed at the at least one side face of the driving backplane 10. On one hand, it may avoid forming through holes in the base substrate 100, thereby avoiding problems such as a reduction in mechanical properties of the substrate 1 and an easy fall-off of wires in the through holes. On another hand, in a case where the substrate 1 is applied to a spliced display apparatus, since the FPC is not used, a seam of the spliced screen may be reduced.

In some embodiments, as shown in FIGS. 1A and 1B, an orthographic projection of the first connecting line 105 on a side face where it is located and an orthographic projection of the corresponding second connecting line 106 on the side face do not overlap. That is, an interface between the first connecting line 105 and the corresponding second connecting line 106 is a region where an end face of the first connecting line 105 and an end face of the second connecting line 106 meet.

In some embodiments, the interface between the first connecting line 105 and the corresponding second connecting line 106 is substantially located at a position at half a thickness of the base substrate 100. For example, as shown in FIGS. 1A and 1B, the thickness of the base substrate 100 is H, and the interface between the first connecting line 105 and the corresponding second connecting line 106 is substantially located at the position at half of the thickness H of the base substrate 100.

In some embodiments, as shown in FIGS. 1A, 1B, 2A and 2B, the first connecting line 105 extends to the first surface 110 of the base substrate 100 and is in lap joint with the at least one first lead 1010, the second connecting line 106 extends to the second surface 120 of the base substrate 10 and is in lap joint with the at least one second lead 1020.

For example, as shown in FIGS. 1A, 1B and 2A, the first connecting line 105 includes a first portion 1051 located on a side face of the base substrate 100 and a second portion 1052 located on the surface of the at least one first lead 1010 facing away from the base substrate 100. An orthographic projection of the second portion 1052 on the base substrate 100 overlaps with an orthographic projection of the first lead 1010 connected to the second portion 1052 on the base substrate 100. In this way, a contact area between the first connecting line 105 and the first lead 1010 may be increased, and a contact resistance between the first connecting line 105 and the first lead 1010 may be further reduced.

In addition, for example, as shown in FIGS. 1A, 1B and 2B, the second connecting line 106 includes a third portion 1061 located on a side face of the base substrate 100 and a fourth portion 1062 located on a surface of the at least one second lead 1020 facing away from the base substrate 100. An orthographic projection of the fourth portion 1062 on the base substrate 100 overlaps with an orthographic projection of the second lead 1020 connected to the fourth portion 1062 on the base substrate 100. In this way, a contact area between the second connecting line 106 and the second lead 1020 may be increased, and a contact resistance between the second connecting line 106 and the second lead 1020 may be further reduced.

In some embodiments, the plurality of first connecting lines 105 are made of a metal material, and the plurality of second connecting lines 106 are also made of a metal material. For example, the metal material may include or may be copper, aluminum, copper alloy, or aluminum alloy. The metal material may have a good conductivity and a low resistivity, which is advantageous for the signal transmission.

In some examples, the plurality of first connecting lines 105 and the plurality of second connecting lines 106 may be made of a same material. In some other examples, the plurality of first connecting lines 105 and the plurality of second connecting lines 106 may be made of different materials.

Figure 4:
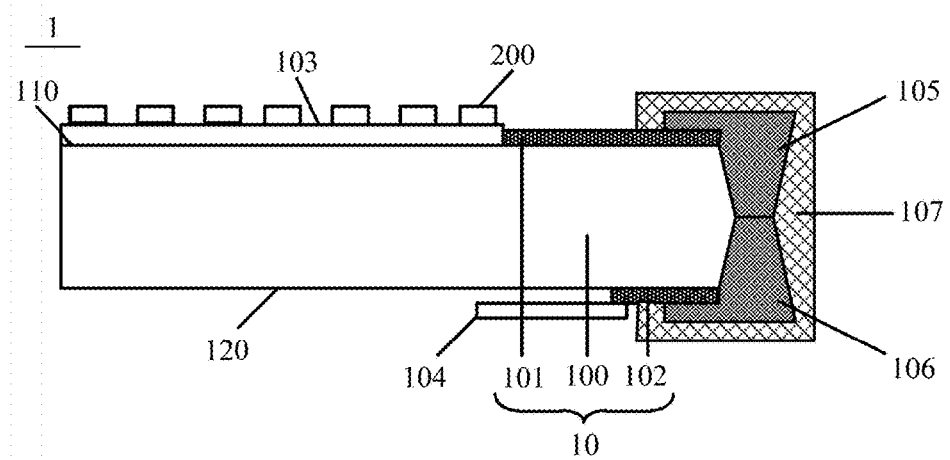
FIG. 4 is a schematic diagram showing a structure of yet another substrate, in accordance with some embodiments of the present disclosure.

In some embodiments, as shown in FIG. 4, the substrate 1 further includes a protective layer 107 disposed on the at least one side face of the driving backplane 10. The protective layer 107 covers the plurality of first connecting lines 105 and the plurality of second connecting lines 106.

The protective layer 107 is used to protect the plurality of first connecting lines 105 and the plurality of second connecting lines 106, to prevent them from being oxidized. In addition, in the case where the substrate 1 is applied to the spliced display apparatus, the protective layer 107 may also prevent abrasion of first connecting lines 105 and second connecting lines 106 on different substrates 1 that is caused by a relative movement between the substrates 1 during splicing.

In some embodiments, the protective layer 107 may include a resin material, such as epoxy resin or acrylic resin.

In some other embodiments, the protective layer 107 further includes a black dye (e.g., carbon black). In this way, the protective layer 107 may also prevent a reflection of light by the plurality of first connecting lines 105 or the plurality of second connecting lines 106 which may affect display effect.

In some embodiments, as shown in FIG. 1B, the substrate 1 further includes the plurality of Micro-LEDs 200 disposed on the first surface 110 of the base substrate 100. For example, the plurality of Micro-LEDs 200 are disposed on other layers on the first surface 110 of the base substrate 100, and constitute the Micro-LED array. The plurality of Micro-LEDs 200 are driven by the driving circuit 103 of driving backplane 10 to emit light. For example, as shown in FIG. 1B, the plurality of Micro-LEDs 200 are disposed on the driving circuit 103 on the first surface 110 of the base substrate 100. The plurality of Micro-LEDs 200 are electrically connected to the driving circuit 103 and are driven by the driving circuit 103 to emit light.

For example, the Micro-LED array is formed by using a mass transfer method. That is, a plurality of light-emitting diode (LED) bare chips are grown on a sapphire supply substrate by using a molecular beam epitaxy method. The plurality of LED bare chips are separated from the supply substrate by using a laser lift-off technology. The plurality of LED bare chips are adsorbed by a patterned transfer substrate. The transfer substrate and the driving backplane 10 are aligned to transfer the plurality of LED bare chips absorbed on the transfer substrate to matching positions on the driving backplane 10. Finally, the transfer substrate is removed.

Figure 5:
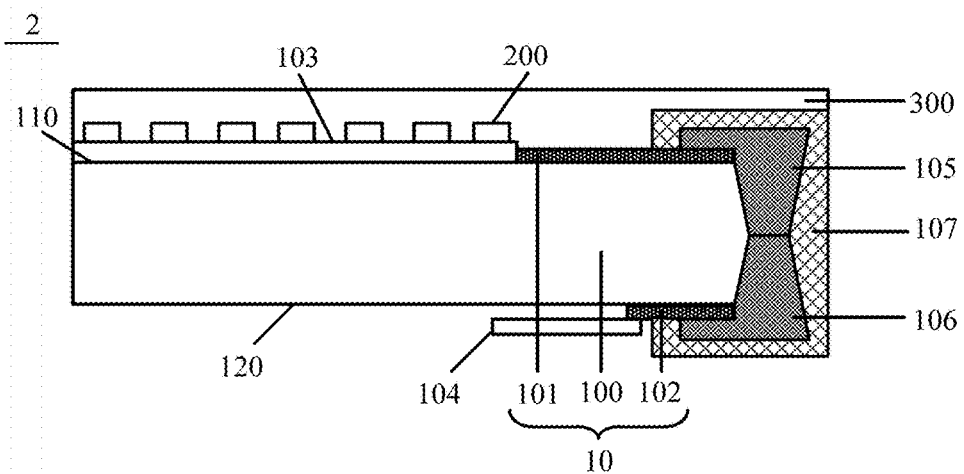
FIG. 5 is a schematic diagram showing a structure of a display panel, in accordance with some embodiments of the present disclosure.

Some embodiments of the present disclosure provide a display panel. As shown in FIG. 5, the display panel 2 includes the substrate 1 described in any one of the above embodiments.

On this basis, the display panel 2 further includes an encapsulation layer 300 for encapsulating the plurality of Micro-LEDs 200.

The display panel 2 has same beneficial effects as the substrate 1, which will not be repeated herein.

Some embodiments of the present disclosure provide a display apparatus. As shown in FIG. 6, the display apparatus includes at least one display panel 2 as above.

In some examples, the display apparatus includes a single display panel 2.

In some other examples, the display apparatus includes a plurality of display panels 2. In this case, as shown in FIG. 6, the plurality of display panels 2 are spliced together, so as to form a large-sized spliced display apparatus.

In a case where the plurality of display panels 2 are spliced together, back surfaces of the plurality of display panels 2 that are opposite to display surfaces are in a same plane, and the display surfaces are light exit surfaces of the display panels 2. For example, the display apparatus further includes a support, and side faces of any two adjacent display panels 2 that face each other are aligned and bonded to the support. FIG. 6 shows an example in which the display apparatus includes four display panels 2, but the embodiments of the present disclosure are not limited thereto.

In the display apparatus provided by some embodiments of the present disclosure, in the substrate 1 of each display panel 2, the plurality of first connecting lines 105 and the plurality of second connecting lines 106 for electrically connecting the first leads 1010 and the second leads 1020 that are respectively located on the first surface 110 and the second surface 120 of the base substrate 100 have a thinner thickness compared with the FPC. Therefore, in the case where the display apparatus includes the plurality of display panels 2, a seam between two adjacent display panels 2 may be very small, and the display effect and an overall aesthetics may be further improved.

Some embodiments of the present disclosure provide a method for manufacturing the substrate 1. As shown in FIG. 7, the method includes S101 to S105.

Figure 8A:
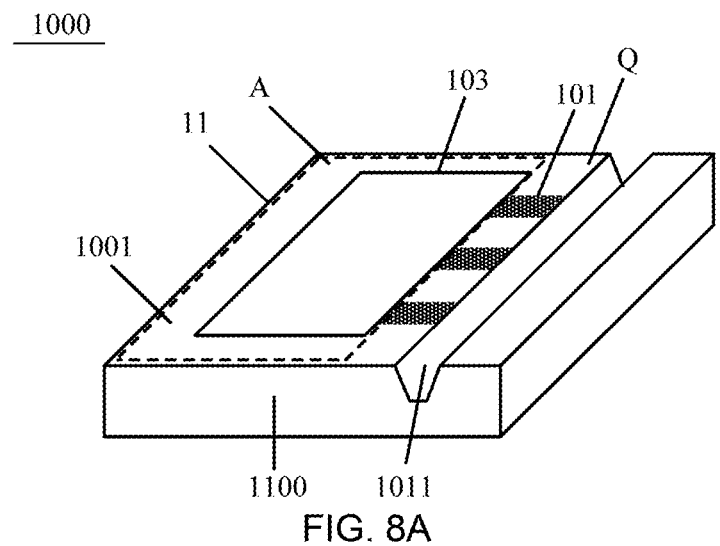
FIG. 8A is a schematic diagram showing a structure formed after a single first strip-shaped groove is formed in a third surface of a driving backplane motherboard, in accordance with some embodiments of the present disclosure.

In S101, as shown in FIG. 8A, at least one strip-shaped groove 1011 corresponding to each driving backplane to be cut 11 is formed in a third surface 1001 of a driving backplane motherboard 1000 which includes at least one driving backplane to be cut 11.

The driving backplane to be cut 11 has a display area A and at least one peripheral region Q located on a periphery of the display area A. Each first lead group 101 and a corresponding second lead group 102 of the driving backplane to be cut 11 are disposed in one peripheral region Q. Each first strip-shaped groove 1011 is in contact with a corresponding peripheral region Q where a first lead group and a second lead group are disposed.

In a case where the driving backplane motherboard 1000 includes a plurality of driving backplanes to be cut 11, structures of the plurality of driving backplanes to be cut 11 are completely the same. There is a cutting region between two adjacent driving backplanes to be cut 11, and the structure of each driving backplane to be cut 11 is the same as a structure of the driving backplane 10. After the driving backplane motherboard 1000 is cut, a plurality of driving backplanes 10 are obtained. It will be seen that, before the driving backplane motherboard 1000 is cut, the plurality of driving backplanes to be cut 11 share a single base motherboard 1100. After the driving backplane motherboard 1000 is cut, a portion of the base motherboard 1100 corresponding to a driving backplane 10 is a base substrate 100.

In a case where the driving backplane motherboard 1000 includes a single driving backplane to be cut 11, the structure of the driving backplane to be cut 11 is the same as the structure of the driving backplane 10. After the driving backplane motherboard 1000 is cut, a single driving backplane 10 is obtained. In this case, since the at least one first strip-shaped groove 1011 is formed in the driving backplane motherboard 1000, the base motherboard 1100 of the driving backplane motherboard 1000 includes at least one portion that will be cut away in addition to a portion corresponding to the driving backplane to be cut 11.

Figure 8B:
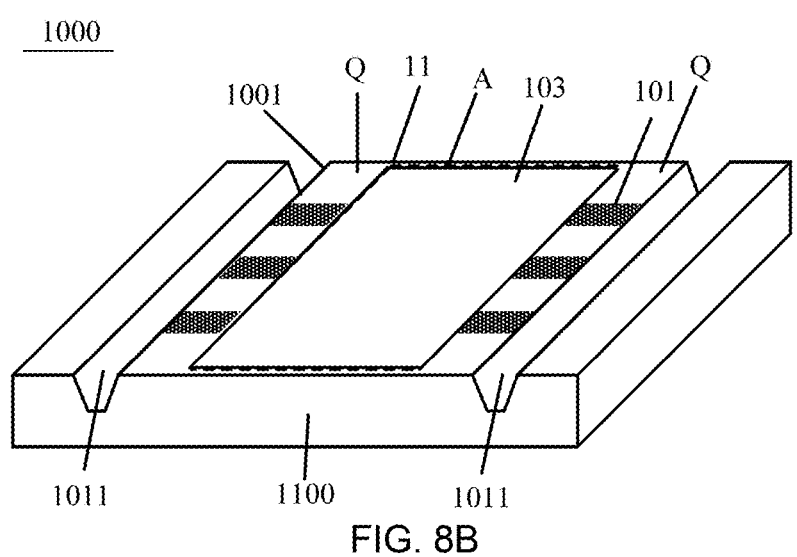
FIG. 8B is a schematic diagram showing a structure formed after two first strip-shaped grooves are formed in a third surface of a driving backplane motherboard, in accordance with some embodiments of the present disclosure.

FIG. 8A only shows an example in which the driving backplane motherboard 1000 includes a single driving backplane to be cut 11, but the embodiments of the present disclosure are not limited thereto. In addition, FIG. 8A only shows an example in which a single strip-shaped groove 1011 is provided corresponding to a single driving backplane to be cut 11. In practice, the number of the at least one first strip-shaped groove 1011 may be selected according to positions of the plurality of first leads 1010. For example, as shown in FIG. 8B, two parallel first strip-shaped grooves 1011 corresponding to the driving backplane to be cut 11 that are located at two opposite edges of the driving backplane to be cut 11 may be formed in the third surface 1001 of the driving backplane motherboard 1000.

The base motherboard 1100 of the driving backplane motherboard 1000 may be a glass motherboard or a flexible resin motherboard (for example, the flexible resin motherboard may be made of polyimide or polyethylene glycol terephthalate).

According to different materials of the base motherboard 1100, the at least one first strip-shaped groove 1011 may be formed in the third surface 1001 of the driving backplane motherboard 1000 by using different processes.

In some examples, the base motherboard 1100 is the glass motherboard. In this case, forming the at least one first stripe-shaped groove 1011 corresponding to each driving backplane to be cut 11 in the third surface 1001 of the driving backplane motherboard includes: forming the at least one first stripe-shaped groove 1011 corresponding to each driving backplane to be cut 11 in the third surface 1001 of the driving backplane motherboard 1000 by using a laser cutting method.

In some other examples, the base motherboard 1100 is the flexible resin motherboard. In this case, forming the at least one first strip-shaped groove 1011 corresponding to each driving backplane to be cut 11 in the third surface 1001 of the driving backplane motherboard 1000 includes: forming the at least one first strip-shaped groove 1011 corresponding to each driving backplane to be cut 11 in the third surface 1001 of the driving backplane motherboard 1000 by using an etching process. For example, photoresist may be first coated on the third surface 1001 of the driving backplane motherboard 1000, and then photoresist in a region where the at least one first strip-shaped groove to be formed is removed through an exposure process and a development process. Then, the driving backplane motherboard 1000 is etched by using a dry etching process to form the at least one first strip-shaped groove 1011 corresponding to each driving backplane to be cut 11, and finally all the remaining photoresist is removed.

In some embodiments, as shown in FIGS. 8A and 8B, the first strip-shaped groove 1011 is in contact with an edge of the peripheral region Q away from the display area A and extends along the edge of the peripheral region Q. In this way, a slotting process is simple, and the first strip-shaped groove 1011 may be easily formed.

In some embodiments, the first strip-shaped groove 1011 formed in the third surface 1001 has a certain depth in a thickness direction of the base motherboard 1100. For example, the depth of the first strip-shaped groove 1011 is half a thickness of the base motherboard 1100. In this way, the base motherboard 1100 may be maintained a certain mechanical strength, and it is possible to prevent a fracture of the base motherboard 1100 along the first stripe-shaped groove 1011 in a subsequent manufacturing process due to an excessive depth of the first stripe-shaped groove 1011.

In S102, a plurality of first connecting lines 105 insulated from each other are formed in a region in which the first strip-shaped groove 1011 is located. Each first connecting line 105 extends to a surface of at least one first lead 1010 and is in contact with the at least one first lead 1010.

In some embodiments, forming the plurality of first connecting lines 105 insulated from each other in the region in which the first strip-shaped groove 1011 is located includes the following steps.

Figure 9A:
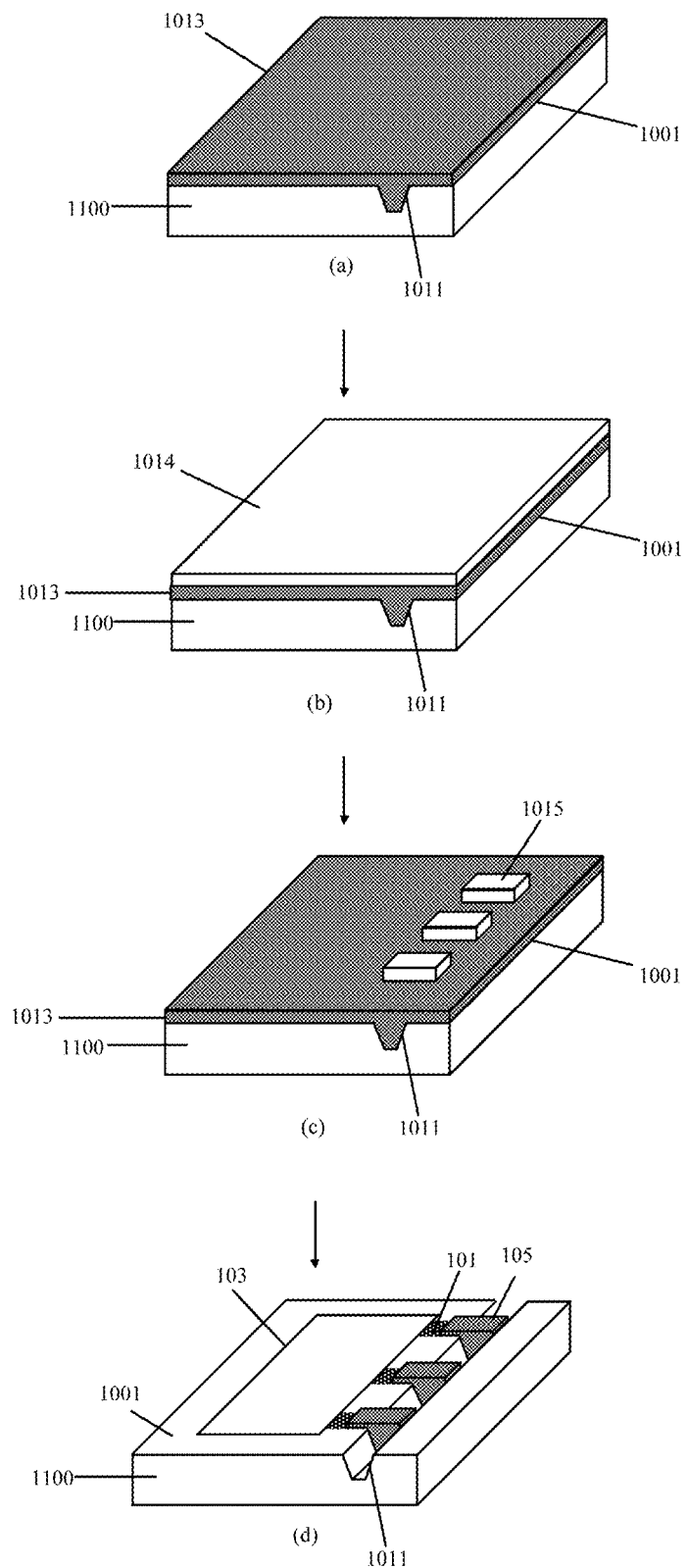
FIG. 9A is a schematic diagram showing a process of forming a plurality of first connecting lines in a first strip-shaped groove, in accordance with some embodiments of the present disclosure.

In S1021, as shown in part (a) in FIG. 9A, a first metal layer 1013 is formed on the third surface 1001 of the driving backplane motherboard 1000 by using a sputtering process. The first metal layer 1013 includes a portion filling the first strip-shaped groove 1011.

For example, taking one of copper, aluminum, copper alloy, or aluminum alloy as a target material, the first metal layer 1013 may be formed on the third surface 1001 of the driving backplane motherboard 1000 by using the sputtering process.

In S1022, as shown in part (b) in FIG. 9A, a first photoresist layer 1014 is formed on the first metal layer 1013.

In S1023, as shown in part (c) in FIG. 9A, the first photoresist layer 1014 is exposed and developed to form a plurality of first photoresist patterns 1015.

An orthographic projection of each first photoresist pattern 1015 on the base motherboard 1100 overlaps with an orthographic projection of a first lead 1010 corresponding to a first connecting line to be formed on the base motherboard 1100 and an orthographic projection of the first strip-shaped groove 1011 on the base motherboard 1100. That is, a position where the first photoresist pattern 1015 is located is a position where a first connecting line 105 will be formed.

In S1024, as shown in part (d) in FIG. 9A, the first metal layer 1013 is etched to form the plurality of first connecting lines 105 insulated from each other in the region in which the first strip-shaped groove 1011 is located.

Each first connecting line 105 is in contact with at least one corresponding first lead 1010. After the plurality of first connecting lines 105 are formed, all the remaining first photoresist patterns 1015 are removed.

Figure 9B:
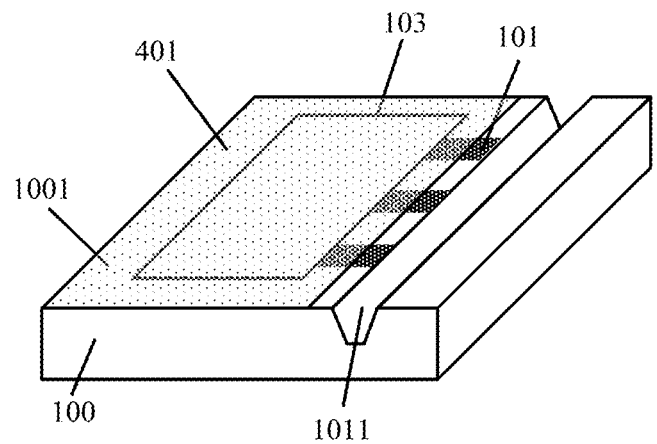
FIG. 9B is a schematic diagram showing a structure formed after a first protective film is formed on a third surface of a driving backplane motherboard, in accordance with some embodiments of the present disclosure.

In some embodiments, before the first metal layer 1013 is formed on the third surface 1001 of the driving backplane motherboard 1000, the method for manufacturing the substrate 1 further includes: as shown in FIG. 9B, forming a first protective film 401 on the third surface 1001, wherein the first protective film 401 exposes a connection terminal of each first lead 1010 for connecting a corresponding first connecting line 105. The first protective film 401 is made of, for example, photoresist or polyimide. The first protective film 401 may protect the plurality of first leads 1010 and the driving circuit 103 to prevent the plurality of first leads 1010 and the driving circuit 103 from being damaged in a process of forming the first connecting lines 105, or to prevent the plurality of first leads 1010 or the driving circuit 103 from being short-circuited due to deposited metal. In a subsequent process, the first protective film 401 will be removed. For example, after the driving backplane 10, the plurality of first connecting lines 105 and the plurality of second connecting lines 106 are formed, the first protective film 401 is removed.

In some other embodiments, forming the plurality of first connecting lines 105 insulated from each other in the region in which the first strip-shaped groove 1011 is located includes the following step.

In S1025, the plurality of first connecting lines 105 insulated from each other are formed in the region in which the first strip-shaped groove 1011 is located by using a first mask through an evaporation process, to obtain the structure shown in part (d) in FIG. 9A.

The evaporation process is a process in which a material to be deposited is used as an evaporation source material, and due to a mask, the material to be deposited is directly deposited onto a region where a pattern to be formed is located.

Figure 10:
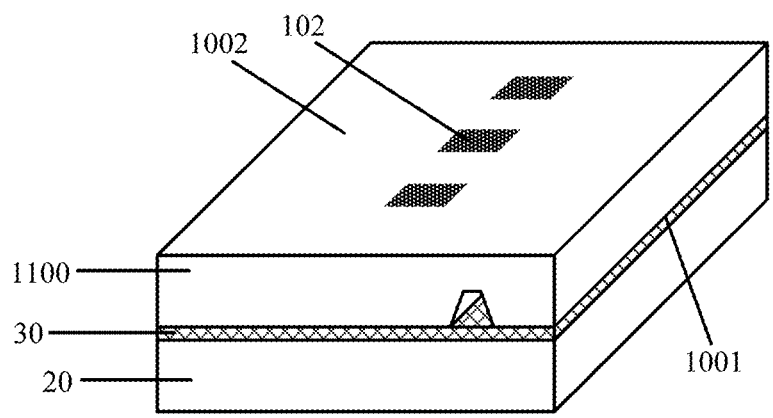
FIG. 10 is a schematic diagram showing a structure formed after a driving backplane motherboard is bonded to a temporary substrate, in accordance with some embodiments of the present disclosure.

On this basis, after the plurality of first connecting lines 105 insulated from each other are formed, the method for manufacturing the substrate 1 further includes: as shown in FIG. 10, turning the driving backplane motherboard 1000 180 degrees, placing the turned driving backplane motherboard 1000 on a temporary substrate 20, and bonding the third surface 1001 of the driving backplane motherboard 1000 to the temporary substrate 20 by a temporary bonding adhesive 30.

The temporary substrate 20 is, for example, a glass substrate. The temporary bonding adhesive 30 is made of, for example, a resin material such as polycarbonate or acrylic acid. Bonding the third surface 1001 of the driving backplane motherboard 1000 to the temporary substrate 20 may prevent the driving backplane motherboard 1000 from being broken at the first strip-shaped groove 1011 in a subsequent process.

Figure 11:
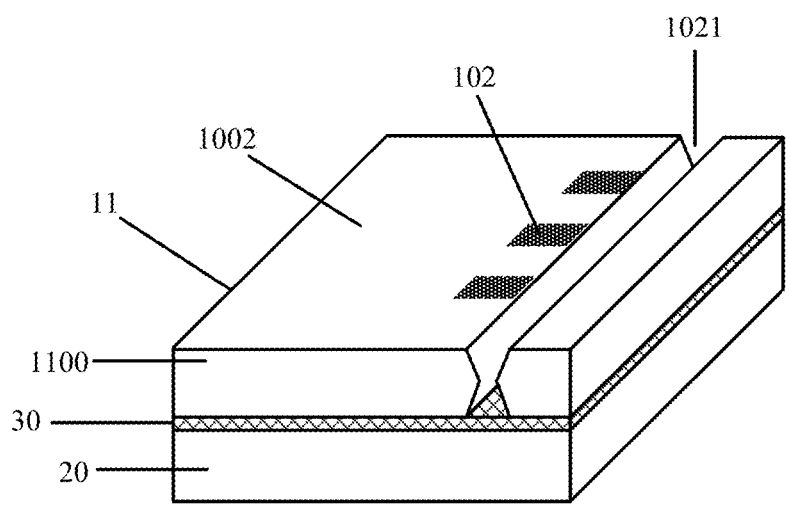
FIG. 11 is a schematic diagram showing a structure formed after a second strip-shaped hole is formed in a fourth surface of a driving backplane motherboard, in accordance with some embodiments of the present disclosure.

In S103, as shown in FIG. 11, at least one second strip-shaped hole 1021 is formed in a fourth surface 1002 of the driving backplane motherboard 1000 that is opposite to the third surface 1001, and each second strip-shaped hole 1021 is connected to a corresponding first strip-shaped groove 1011. That is, the number of the at least one second strip-shaped hole 1021 and the number of the at least one first strip-shaped groove 1011 are the same, and the positions of the two are in one-to-one correspondence.

A method for forming the at least one second strip-shaped hole 1021 in the fourth surface 1002 of the driving backplane motherboard 1000 is similar to the method for forming the at least one strip-shaped groove 1011 in the third surface 1001 of the driving backplane motherboard 1000, and different processes may be used according to different materials of the base motherboard 1100.

In some examples, the base motherboard 1100 is the glass motherboard. In this case, forming the at least one second strip-shaped hole 1012 in the fourth surface 1002 of the driving backplane motherboard 1000 includes: forming the at least one second strip-shaped hole 1021 in the fourth surface 1002 of the driving motherboard 1000 by using the laser cutting method.

In some other examples, the base motherboard 1100 is the flexible resin motherboard. In this case, forming the at least one second strip-shaped hole 1021 in the fourth surface 1002 of the driving backplane motherboard 1000 includes: forming the at least one second strip-shaped hole 1021 in the fourth surface 1002 of the driving motherboard 1000 by using the etching process.

In some embodiments, as shown in FIG. 11, the second strip-shaped hole 1021 is in contact with an edge of the peripheral region Q away from the display area A and extends along the edge of the peripheral region Q. In this way, a slotting process is simple, and the second strip-shaped hole 1021 may be easily formed.

In S104, a plurality of second connecting lines 106 insulated from each other are formed in a region in which the second strip-shaped hole 1021 is located, and each second connecting line 106 is in contact with a corresponding first connecting line 105. The second connecting line 106 extends to a surface of at least one second lead 1020 and is in contact with the at least one second lead 1020 in the second lead group 102.

In some embodiments, forming the plurality of second connecting lines 106 insulated from each other in the region in which the second strip-shaped hole 1021 is located includes the following steps.

Figure 12A:
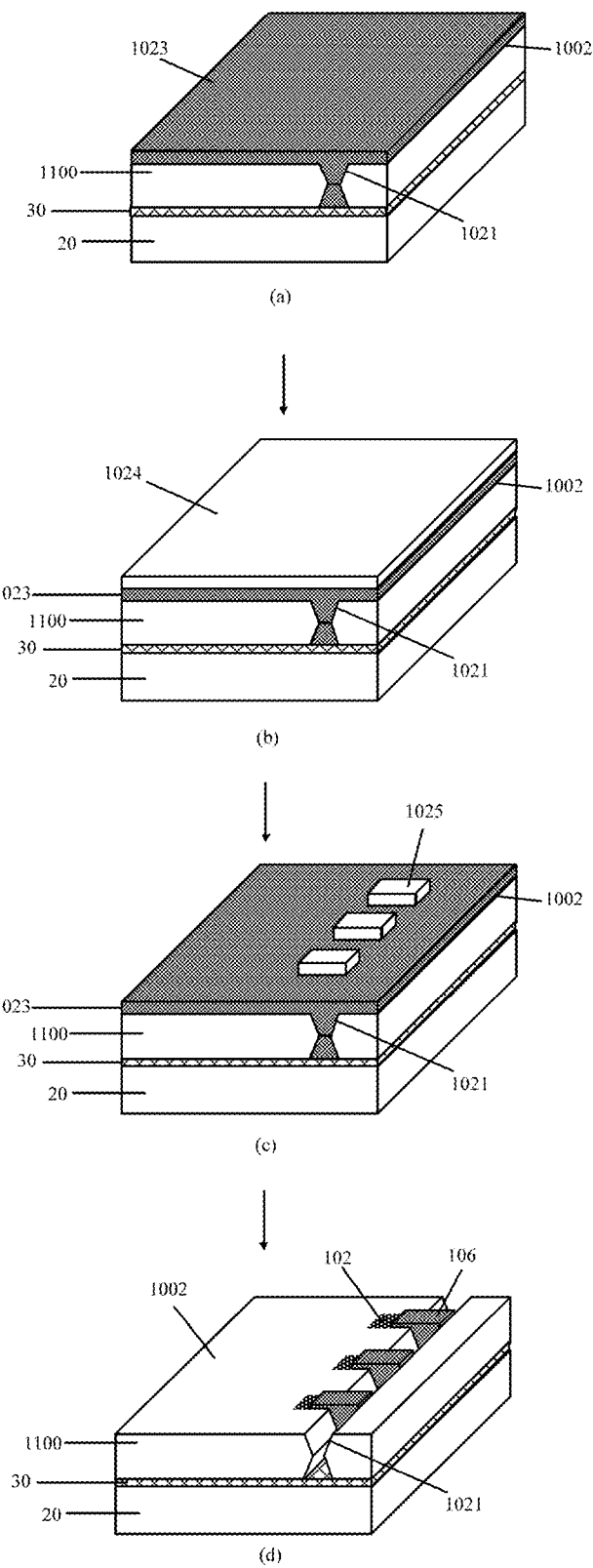
FIG. 12A is a schematic diagram showing a process of forming a plurality of second connecting lines in a second strip-shaped hole, in accordance with some embodiments of the present disclosure.

In S1041, as shown in part (a) in FIG. 12A, a second metal layer 1023 is formed on the fourth surface 1002 of the driving backplane motherboard 1000 by using the sputtering process. The second metal layer 1023 includes a portion filling the second strip-shaped hole 1021.

In S1042, as shown in part (b) in FIG. 12A, a second photoresist layer 1024 is formed on the second metal layer 1023.

In S1043, as shown in part (c) in FIG. 12A, the second photoresist layer 1024 is exposed and developed to form a plurality of second photoresist patterns 1025.

An orthographic projection of each second photoresist pattern 1025 on the base motherboard 1100 overlaps with an orthographic projection of a second lead 1020 corresponding to a second connecting line to be formed on the base motherboard 1100 and an orthographic projection of the second strip-shaped hole 1021 on the base motherboard 1100. That is, a position where the second photoresist pattern 1025 is located is a position where a second connecting line 106 will be formed.

In S1044, as shown in part (d) in FIG. 12A, the second metal layer 1023 is etched to form the plurality of second connecting lines 106 insulated from each other in the region in which the second strip-shaped hole 1021 is located.

Each second connecting line 106 is in contact with at least one corresponding second lead 1020. After the plurality of second connecting lines 106 are formed, all the remaining second photoresist patterns 1025 are removed.

Figure 12B:
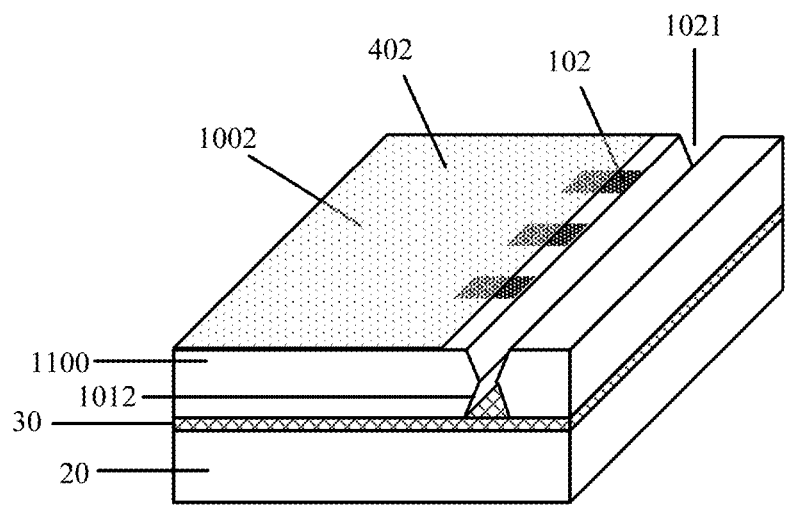
FIG. 12B is a schematic diagram showing a structure formed after a second protective film is formed on a fourth surface of a driving backplane motherboard, in accordance with some embodiments of the present disclosure.

In some embodiments, before the second metal layer 1023 is formed on the fourth surface 1002 of the driving backplane motherboard 1000, the method for manufacturing the substrate 1 further includes: as shown in FIG. 12B, forming a second protective film 402 on the fourth surface 1002, wherein the second protective film 402 exposes a connection terminal of each second lead 1020 for connecting a corresponding second connecting line 106. The second protective film 402 is made of, for example, photoresist or polyimide. The second protective film 402 may protect the plurality of second leads 1020 to prevent the plurality of second leads 1020 from being damaged in a process of forming the second connecting lines 106, or to prevent the plurality of second leads 1020 from being short-circuited due to deposited metal. In a subsequent process, the second protective film 402 will be removed. For example, after the driving backplane 10, the plurality of first connecting lines 105 and the plurality of second connecting lines 106 are formed, the second protective film 402 is removed.

In some other embodiments, forming the plurality of second connecting lines 106 insulated from each other in the region in which the second strip-shaped hole 1021 is located includes the following step.

In 1045, the plurality of second connecting lines 106 insulated from each other are formed in the region in which the second strip-shaped hole 1021 is located by using a second mask through the evaporation process, to obtain the structure shown in part (d) in FIG. 12A.

Figure 13:
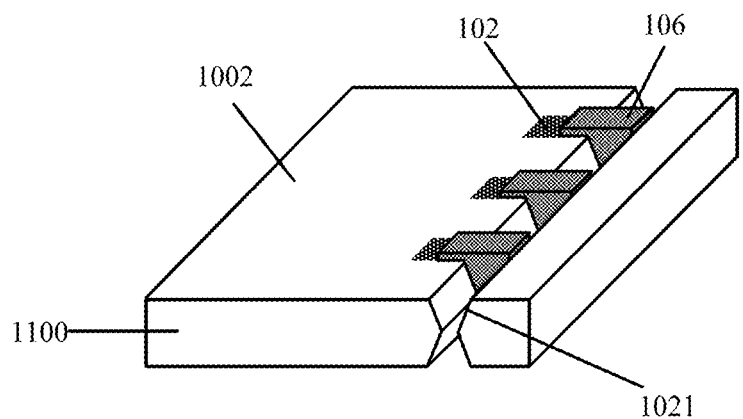
FIG. 13 is a schematic diagram showing a structure formed after a driving backplane motherboard is separated from a temporary substrate, in accordance with some embodiments of the present disclosure.

On this basis, after the plurality of second connecting lines 106 are formed, the method for manufacturing the substrate 1 further includes: separating the temporary substrate 20 from the driving backplane motherboard 1000 to obtain the structure shown in FIG. 13.

For example, according to different materials of the temporary bonding adhesive 30, the temporary bonding adhesive 30 may be removed by using a heating method or an illumination method to debond the temporary substrate 20 from the driving backplane motherboard 1000, thereby separating the temporary substrate 20 from the driving backplane motherboard 1000.

In S105, the driving backplane motherboard 1000 is cut into at least one driving backplane 10. The plurality of first connecting lines 105 insulated from each other and the plurality of second connecting lines 106 insulated from each other are formed on at least one side face of each driving backplane 10.

In some embodiments, cutting the driving backplane motherboard 1000 includes: cutting the driving backplane motherboard 1000 along inner walls of the second strip-shaped hole 1021 and the corresponding first strip-shaped groove 1011 away from the display area A by using a laser cutting method.

Figure 14:
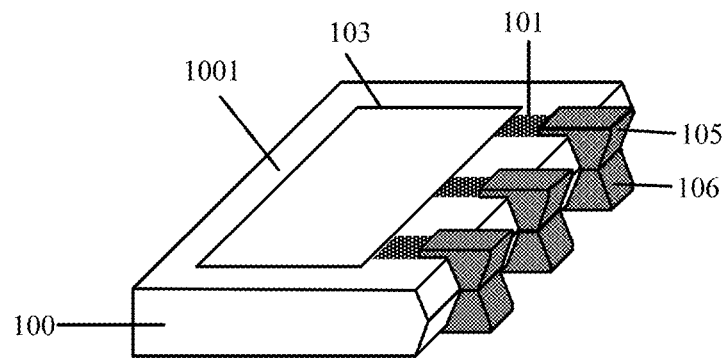
FIG. 14 is a schematic diagram showing a structure of a substrate, in accordance with some embodiments of the present disclosure.

For example, a portion of the base motherboard 1100 on a side of the first and second connecting lines 105 and 106 away from the first and second leads 1010 and 1020 may be separated from the first and second connecting lines 105 and 106, by using the laser cutting method, thereby obtaining the structure shown in FIG. 14.

In some embodiments, the method for manufacturing the substrate 1 further includes: referring to FIG. 4, forming the protective layer 107 at the at least one side face of the substrate 1 by using a transfer printing method or a pad printing method. The protective layer 107 covers the plurality of first connecting lines 105 and the plurality of second connecting lines 106. The protective layer 107 is used to protect the plurality of first connecting lines 105 and the plurality of second connecting lines 106, to prevent them from being oxidized. The protective layer 107 may also prevent the abrasion of the plurality of first connecting lines 105 and the plurality of second connecting lines 106 on different substrates 1 which is caused by the relative movement between the substrates 1 during the splicing.

In some examples, the protective layer 107 may include the resin material, such as the epoxy resin or the acrylic resin.

In some other examples, the protective layer 107 further includes the black dye (e.g., the carbon black). On this basis, the protective layer 107 may also prevent the reflection of the light by the plurality of first connecting lines 105 and the plurality of second connecting lines 106 which may affect the display effect.

The forgoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A substrate, comprising:
    a driving backplane, having a display area and at least one peripheral region located on a periphery of the display area, the driving backplane including:
        a base substrate, including a first surface and a second surface opposite to the first surface; and
        at least one first lead group disposed on the first surface of the base substrate, each first lead group including a plurality of first leads; and
        at least one second lead group disposed on the second surface of the base substrate, a first lead group and a corresponding second lead group being disposed in a peripheral region; and each second lead group including a plurality of second leads;
    a plurality of first connecting lines insulated from each other, the plurality of first connecting lines being disposed on at least one side face of the driving backplane adjacent to at least one peripheral region where the at least one first lead group and the at least one second lead group are disposed, each first connecting line being electrically connected to at least one first lead; and
    a plurality of second connecting lines insulated from each other, the plurality of second connecting lines being disposed on the at least one side face of the driving backplane, and each second connecting line being electrically connected to at least one second lead, and being in contact with a corresponding first connecting line, wherein an interface between the first connecting line and the corresponding second connecting line is a region where an end face of the first connecting line and an end face of the corresponding second connecting line meet; and
    the interface between the first connecting line and the corresponding second connecting line is substantially located at a position at half a thickness of the base substrate.

2. The substrate according to claim 1, wherein the first connecting line extends to the first surface of the base substrate and is in lap joint with the at least one first lead; and the second connecting line extends to the second surface of the base substrate and is in lap joint with the at least one second lead.

3. The substrate according to claim 1, further comprising a protective layer disposed on the at least one side face, the protective layer covering the plurality of first connecting lines and the plurality of second connecting lines.

4. The substrate according to claim 3, wherein the protective layer includes a resin material.

5. The substrate according to claim 1, wherein the plurality of first connecting lines and the plurality of second connecting lines are made of a same metal material or different metal materials.

6. The substrate according to claim 1, further comprising a plurality of micro light-emitting diodes (Micro-LEDs) disposed on the first surface of the base substrate.

7. A display panel, comprising the substrate according to claim 1.

8. A display apparatus, comprising at least one display panel according to claim 7.

9. The display apparatus according to claim 8, wherein the at least one display panel includes a plurality of display panels that are spliced together.

10. A method for manufacturing the substrate according to claim 1, the method comprising:
    forming at least one first strip-shaped groove corresponding to each driving backplane to be cut in a third surface of a driving backplane motherboard which includes at least one driving backplane to be cut, wherein the driving backplane to be cut has a display area and at least one peripheral region located on a periphery of the display area; and each first lead group and a corresponding second lead group of the driving backplane to be cut are disposed in one peripheral region; and each first strip-shaped groove is in contact with a corresponding peripheral region where a first lead group and a second lead group are disposed;
    forming a plurality of first connecting lines insulated from each other in a region in which the first strip-shaped groove is located, wherein each first connecting line extends to a surface of at least one first lead and is in contact with the at least one first lead;
    forming at least one second strip-shaped hole in a fourth surface of the driving backplane motherboard that is opposite to the third surface, each second strip-shaped hole being connected to a corresponding first strip-shaped groove;
    forming a plurality of second connecting lines insulated from each other in a region in which the second strip-shaped hole is located, wherein each second connecting line is in contact with a corresponding first connecting line, and the second connecting line extends to a surface of at least one second lead and is in contact with the at least one second lead; and
    cutting the driving backplane motherboard to obtain at least one driving backplane, and the plurality of first connecting lines and the plurality of second connecting lines that are formed on at least one side face of each driving backplane.

11. The method according to claim 10, wherein each second strip-shaped hole and a corresponding first strip-shaped groove are both in contact with an edge of a corresponding peripheral region away from the display area and extend along the edge of the corresponding peripheral region.

12. The method according to claim 10, wherein a base motherboard of the driving backplane motherboard is a glass motherboard;
forming the at least one first strip-shaped groove corresponding to each driving backplane to be cut in the third surface of the driving backplane motherboard includes:
forming the at least one first strip-shaped groove corresponding to each driving backplane to be cut in the third surface of the driving backplane motherboard by using a laser cutting method; and
forming the at least one second strip-shaped hole in the fourth surface of the driving backplane motherboard includes:
forming the at least one second strip-shaped hole in the fourth surface of the driving backplane motherboard by using the laser cutting method.

13. The method according to claim 10, wherein a base motherboard of the driving backplane motherboard is a flexible resin motherboard;
forming the at least one first strip-shaped groove corresponding to each driving backplane to be cut in the third surface of the driving backplane motherboard includes:
forming the at least one first strip-shaped groove corresponding to each driving backplane to be cut in the third surface of the driving backplane motherboard by using an etching process; and
forming the at least one second strip-shaped hole in the fourth surface of the driving backplane motherboard includes:
forming the at least one second strip-shaped hole in the fourth surface of the driving backplane motherboard by using the etching process.

14. The method according to claim 10, wherein forming the at least one first strip-shaped groove corresponding to each driving backplane to be cut includes:
forming a single first strip-shaped groove corresponding to the driving backplane to be cut, or
forming two first strip-shaped grooves parallel to each other and located at two opposite edges of the driving backplane to be cut, respectively.

15. The method according to claim 10, wherein
forming the plurality of first connecting lines insulated from each other includes:
forming a first metal layer on the third surface of the driving backplane motherboard by using a sputtering process, the first metal layer including a portion filling the first strip-shaped groove;
forming a first photoresist layer on the first metal layer;
exposing and developing the first photoresist layer; and
etching the first metal layer to form the plurality of first connecting lines insulated from each other in the region in which the first strip-shaped groove is located;
and/or
forming the plurality of second connecting lines insulated from each other includes:
forming a second metal layer on the fourth surface of the driving backplane motherboard by using the sputtering process, the second metal layer including a portion filling the second strip-shaped hole;
forming a second photoresist layer on the second metal layer;
exposing and developing the second photoresist layer; and
etching the second metal layer to form the plurality of second connecting lines insulated from each other in the region in which the second strip-shaped hole is located.

16. The method according to claim 10, wherein
forming the plurality of first connecting lines insulated from each other includes:
forming the plurality of first connecting lines insulated from each other through an evaporation process by using a first mask;
and/or
forming the plurality of second connecting lines insulated from each other includes:
forming the plurality of second connecting lines insulated from each other through the evaporation process by using a second mask.

17. The method according to claim 10, after the plurality of first connecting lines are formed, the method further comprises:
turning the driving backplane motherboard 180 degrees;
placing the turned driving backplane motherboard on a temporary substrate; and
bonding the third surface of the driving backplane motherboard to the temporary substrate by a temporary bonding adhesive; and
after the plurality of second connecting lines are formed, the method further comprises:
separating the temporary substrate from the driving backplane motherboard.

18. The method according to claim 10, wherein cutting the driving backplane motherboard includes:
cutting the driving backplane motherboard by using a laser cutting method.

* * * * *